(12) United States Patent
Lai

(10) Patent No.: US 6,762,624 B2
(45) Date of Patent: Jul. 13, 2004

(54) CURRENT MODE LOGIC FAMILY WITH BIAS CURRENT COMPENSATION

(75) Inventor: Benny W. Lai, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 15 days.

(21) Appl. No.: 10/233,715

(22) Filed: Sep. 3, 2002

(65) Prior Publication Data

US 2004/0041593 A1 Mar. 4, 2004

(51) Int. Cl.[7] .............................................. H03K 19/20
(52) U.S. Cl. ...................................... 326/115; 326/87
(58) Field of Search .............................. 326/115, 126, 326/127, 82, 83, 86, 87

(56) References Cited

U.S. PATENT DOCUMENTS

| | | | |
|---|---|---|---|
| 4,145,623 A | | 3/1979 | Doucette |
| 5,889,431 A | * | 3/1999 | Csanky ........................ 327/543 |
| 5,909,127 A | * | 6/1999 | Pearson et al. .............. 326/115 |
| 6,028,454 A | | 2/2000 | Elmasry et al. |
| 6,222,386 B1 | * | 4/2001 | Alford et al. .................. 326/80 |

* cited by examiner

*Primary Examiner*—James H. Cho

(57) ABSTRACT

In one aspect, a circuit system includes a logic circuit and a bias circuit. The logic circuit includes one or more current mode logic gates each of which is operable to steer a respective tail current to produce an output voltage swing. The bias circuit is operable to maintain the voltage swing of each current mode logic gate independent of changes in tail current level. In another aspect, the circuit system includes a switching speed reference circuit that is operable to detect intrinsic switching speeds of the one or more current mode logic gates. In another aspect, the circuit system includes a tail current adjustment circuit that is operable to dynamically adjust the current mode logic gate tail currents to maintain logic gate switching speed in correlation with a reference clock frequency.

23 Claims, 6 Drawing Sheets

CURRENT MODE LOGIC FAMILY WITH BIAS CURRENT COMPENSATION

BACKGROUND

The majority of logic circuitry that is built today with CMOS technology is designed with rail-to-rail logic, in which all switching paths between the supply and ground are connected serially with complementary NFET (n-type field effect transistor) and PFET (p-type field effect transistor) devices. In the static state, no current is drawn in rail-to-rail logic circuitry because either the PFET or the NFET devices are turned off. Current is only needed during transitions. Thus, power is dissipated proportionally with the transition frequency (or clock speed).

For circuits requiring minimal supply bounce at the $V_{dd}$ and ground rails, as well as maximum isolation, voltage ripples arising from current spikes during the transitions of the traditional rail-to-rail CMOS logic family must be carefully suppressed. As clock speeds exceed multi-gigabit rates, this problem gets much harder to control. In these operating environments, an alternative logic family, known as CML (current mode logic), typically is used. In the CML logic family, a constant current always is present for each switch. The steering of this current generates a differential voltage that corresponds to logic 1 or logic 0. The CML logic family reduces current spikes, but requires power consumption regardless of clock speed or logic transitions.

Referring to FIG. 1, a traditional CML logic buffer 10 consists of a differential pair of transistors 12, 14, load resistors 16, 18, and a current source 20 that feeds the sources of the differential transistor pair. Additional stacks of differential pairs may be inserted into the logic tree to merge logic. For example, as shown in FIG. 2, three differential pairs may be used to form a latch 22. Referring to FIG. 3, the bias current for a CML current source typically is provided by a master reference current source 24 feeding a reference current ($I_{ref}$) into a diode-configured NFET current mirror 26. The master current ($I_{ref}$) is derived from a voltage-to-current (V-I) converter using a source of a constant voltage ($V_{ref}$), which may be derived from a band-gap voltage reference, and a resistor (R). The resistor may match the load resistor of a CML gate, or it may be an external or laser trimmed precision resistor if constant current is desired.

The speed of a CML logic cell depends on the RC time constants at the load resistors, as well as the switching speed of the FET differential pair switches. During manufacture, the value of the load resistance is selected first. Then, the value of current source is selected by device size to achieve an acceptable voltage swing across the load resistors. The voltage swing typically corresponds to the voltage needed to switch the next CML logic gate.

For a CML circuit to meet timing requirements in a large volume manufacturing environment, the speed of the CML gates must be designed for the slowest corner case, which typically corresponds to the slowest FET devices, the highest load resistor tolerance that is guaranteed by the IC process, the highest temperature, and lowest $V_{dd}$ required. With this requirement fulfilled, the same design must be specified and guaranteed for its maximum power consumption under its worst case condition, which typically corresponds to the fastest FET devices and lowest load resistor tolerance of the IC process, and the highest temperature and highest $V_{dd}$ required by the product. Since minimal power dissipation translates directly into lower packaging costs and higher reliability, low power consumption is a major competitive advantage of a given circuit design. Presently, the maximum power dissipated by the CML logic family is dictated by the current required for the slow case corner.

SUMMARY

In one aspect, the invention features a circuit system that includes a logic circuit and a bias circuit. The logic circuit includes one or more current mode logic gates each of which is operable to steer a respective tail current to produce an output voltage swing. The bias circuit is operable to maintain the voltage swing of each current mode logic gate independent of changes in tail current level.

In another aspect, the invention features a circuit system that includes a logic circuit and a switching speed reference circuit. The logic circuit includes one or more current mode logic gates each of which is operable to steer a respective tail current to produce an output voltage swing. The switching speed reference circuit is operable to detect intrinsic switching speeds of the one or more current mode logic gates.

In another aspect, the invention features a circuit system that includes a logic circuit and a tail current adjustment circuit. The logic circuit includes one or more current mode logic gates each of which is operable to steer a respective tail current to produce an output voltage swing. The tail current adjustment circuit is operable to dynamically adjust the current mode logic gate tail currents to maintain logic gate switching speed in correlation with a reference clock frequency.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
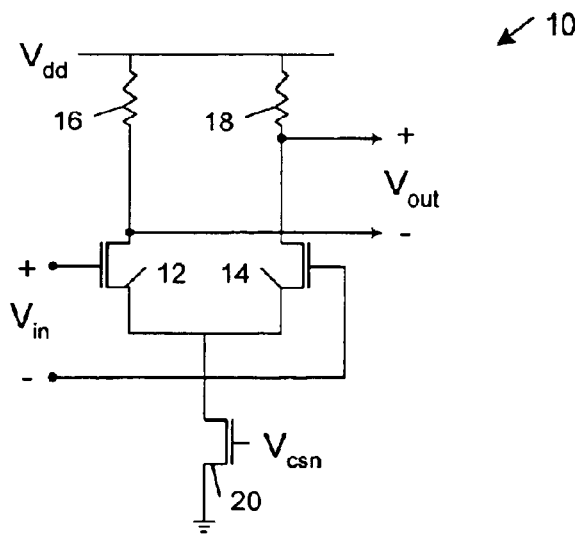
FIG. 1 is a circuit diagram of a prior art current mode logic buffer circuit.
Figure 2:
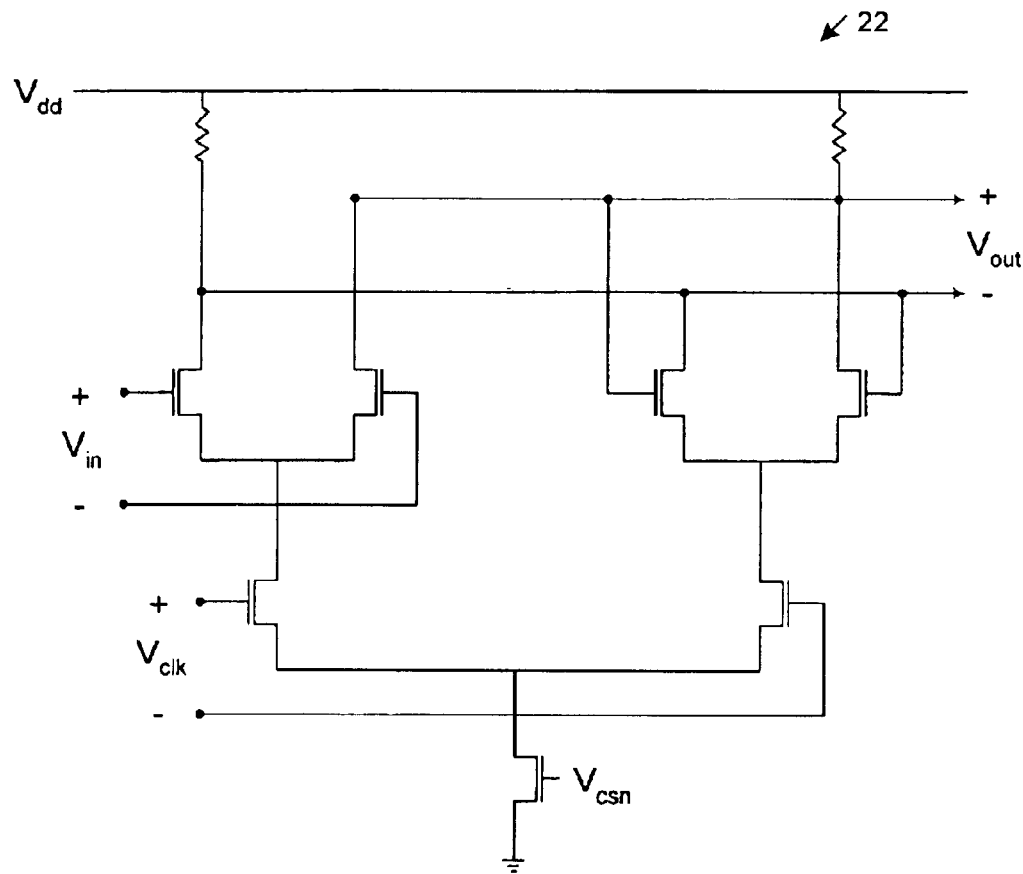
FIG. 2 is a circuit diagram of a prior art current mode logic latch circuit.
Figure 3:
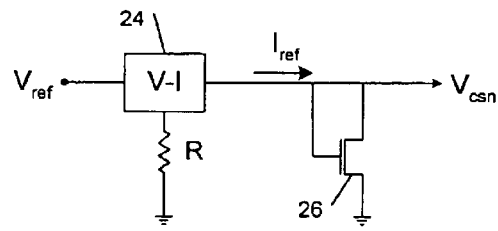
FIG. 3 is a circuit diagram of a prior art master reference current source feeding a diode configured field effect transistor current mirror.
Figure 4:
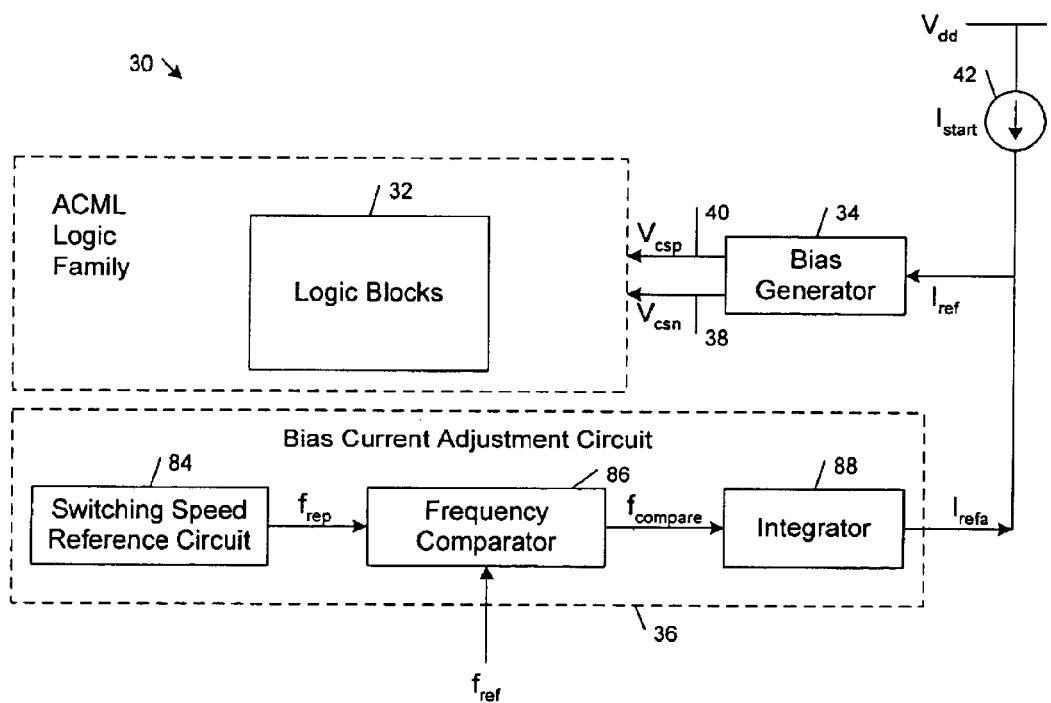
FIG. 4 is a block diagram of a circuit that includes an adjustable current mode logic family, a bias generator, a bias current adjustment circuit, and a startup current source.

Referring to FIG. 4, in one embodiment, a circuit system 30 includes a set 32 of logic blocks, which may be configured to perform any one of a wide variety of different circuit functions, a bias generator 34, and a bias current adjustment circuit 36. In the illustrated embodiment, the set 32 of logic blocks is implemented in accordance with a common adjustable common mode logic (ACML) design. In accordance with this ACML design, each ACML logic block includes a current source, a load with an adjustable load resistance, and a differential pair current steering network. Bias generator 34 has a source setting output 38, which is coupled to the current sources of the ACML logic blocks, and a load resistance setting output 40, which is coupled to the loads of the ACML logic blocks. Bias generator 34 is operable to set the ACML current sources to supply a given source current based on a reference current ($I_{ref}$), which corresponds to the combination of a reference current ($I_{refa}$) that is supplied by bias current adjustment circuit 36 and a startup current ($I_{start}$) that is supplied by a startup current source 42. Bias generator 34 also is operable to set the ACML loads inversely with respect to the source currents to load resistance levels substantially maintaining logic swing levels for a given current source setting. In this way, the bias generator 34 enables the current that is required for the ACML logic to be adjusted such that the timing requirements at the slowest corner case and power dissipation at the fastest corner case may be decoupled. In particular, the bias generator enables the ACML bias current to be increased for slow corner cases and to be decreased for fast corner cases, and automatically adjusts the ACML load resistance levels to maintain the required logic swing levels. In this way, the maximum power dissipation normally associated with the fast process corner case is avoided. This reduces the overall upper range of the power dissipation, which results in lower costs in package requirements and higher reliability.

Figure 5:
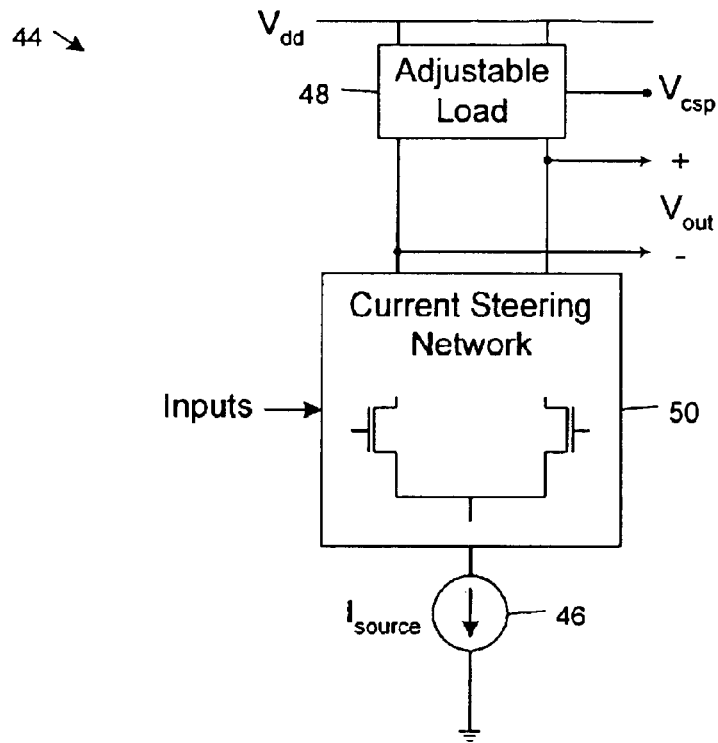
FIG. 5 is a diagrammatic view of an adjustable current mode logic circuit that includes an adjustable load, a differential pair current steering network, and a current source.

Referring to FIG. 5, in general, an ACML logic block 44 includes a current source 46, an adjustable load 48, and a differential pair steering network 50. Current source 46 is coupled to a first voltage rail (e.g., ground) and is operable to supply a source current ($I_{source}$) Adjustable load 48 is coupled to a second voltage rail (e.g., $V_{dd}$) and has an load resistance that is adjustable in accordance with the level of a received load resistance setting voltage $V_{csp}$. Differential pair current steering network 50 includes complementary inputs and outputs and one or more differential pairs that are coupled between the current source and the load.

Figure 6:
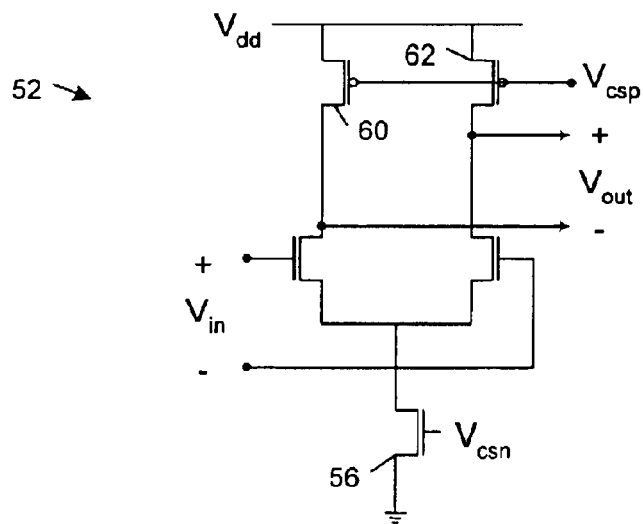
FIG. 6 is a circuit diagram of a buffer implementation of the adjustable current mode logic circuit of FIG. 5.
Figure 7:
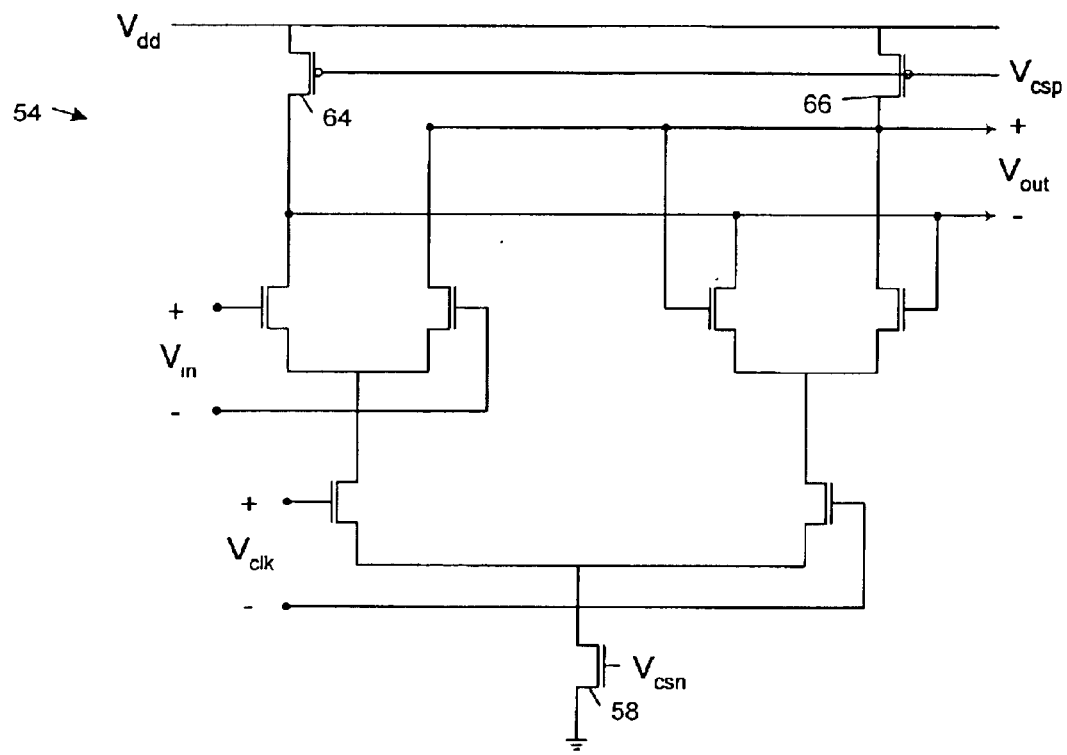
FIG. 7 is a circuit diagram of a latch implementation of the adjustable current mode logic circuit of FIG. 5.

Referring to FIGS. 6 and 7, the ACML logic block 44 may be implemented in the form of any one of a wide variety of different logic circuits, including a buffer 52 and a latch 54. In these implementations, the ACML current sources are n-type field effect transistors (NFETs) 56, 58 that are tied to ground. The source current setting output 38 of bias generator 34 applies a bias voltage ($V_{csn}$) to set the tail currents that are supplied by NFET current sources 56, 58. In these implementations, the adjustable loads are p-type field effect transistors (PFETs) 60, 62, 64, 66. The load resistance setting output 40 of bias generator 34 applies a bias voltage ($V_{csp}$) that is in the triode biasing region of the PFET loads 60–66. In these implementations, the PFET loads 60–66 act as variable resistors with resistance values that are adjusted by bias generator 34 to maintain the required logic swing level for the various tail current levels that may be set by bias generator 34.

Figure 8:
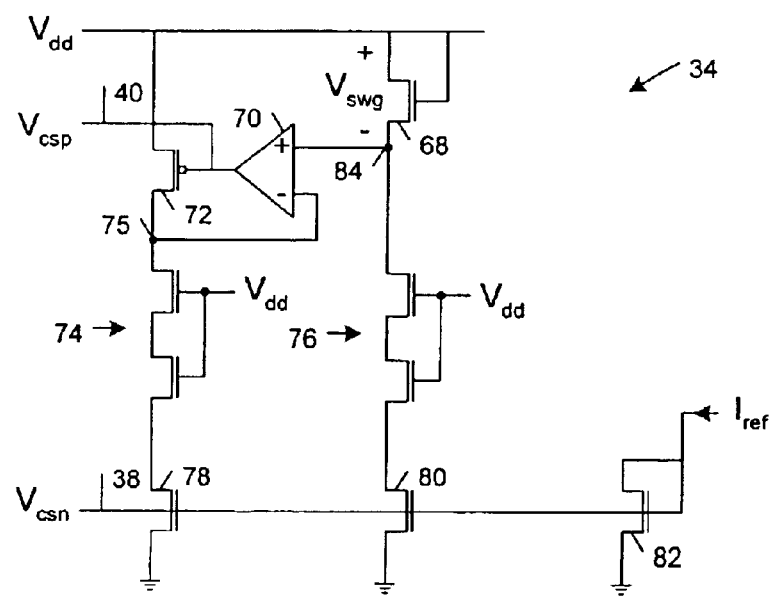
FIG. 8 is a circuit diagram of an implementation of the bias generator of FIG. 4.

Referring to FIG. 8, in some embodiments, bias generator 34 may include a logic swing setting transistor 68, an operational amplifier 70, an output transistor 72, a pair of level shifters 74, 76, and a pair of current source transistors 78, 80. The reference current $I_{ref}$ feeds into an NFET diode current mirror 82, which develops the source current setting output bias $V_{csn}$. This bias also drives current source transistors 78, 80. In the illustrated embodiment, the level shifter 74 and the output transistor 72 replicate the logic stack of the ACML logic circuit 54, which compensates for the early effect of the current source transistor 78 to match closely with current source transistor 58. In particular, output transistor 72 replicates the PFET loads 60–66 and the level shifter replicates two levels of ACML switching. Level shifter 76 also replicates two levels of ACML switching. The logic swing setting transistor 68 is coupled as a diode between the $V_{dd}$ rail and a logic swing setting output 84. A logic swing voltage ($V_{swg}$) develops across logic swing setting transistor 68 in response to current that is supplied by current source transistor 80. The resulting voltage (i.e., $V_{swg}$) at the logic swing setting output 84 is fed into the non-inverting input of operational amplifier 70. Operational amplifier 70 is coupled as a follower between the logic swing setting output 84 and the load resistance setting output 40 of bias generator 34, and the voltage output of operational amplifier 70 corresponds to the load resistance setting output bias $V_{csp}$.

Figure 9:
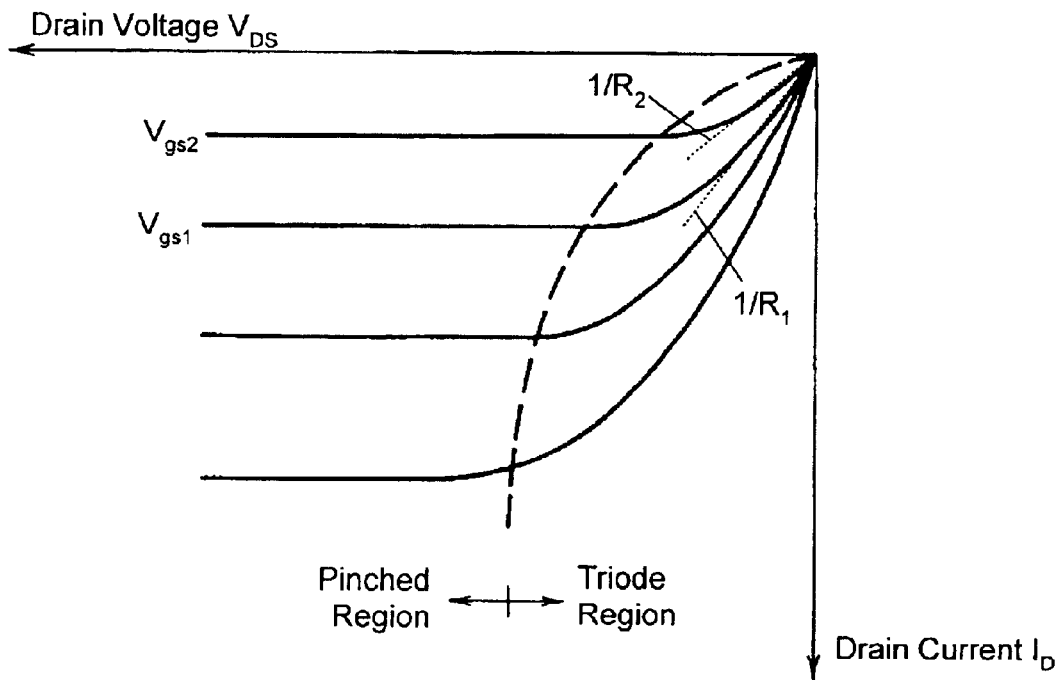
FIG. 9 is a diagrammatic graph of the drain current of a p-channel enhancement mode MOSFET.

In operation, let us first assume that the voltage $V_{swg}$ is set to the desired level relatively independent of the bias current $I_{ref}$. When the $I_{ref}$ is increased or reduced, the current through the current source 78, and the P-channel FET 72 changes proportionally. The operational amplifier 70 monitors the voltage at node 75, and adjusts the $V_{csp}$ node 40 to vary the resistance of the FET 72, such that node 75 is the same as the voltage at node 84. The load transistor FET 72 is operating in its linear triode region, and its resistance is adjusted by varying its gate voltage ($V_{gs}$), as shown in FIG. 9.

Figure 10:
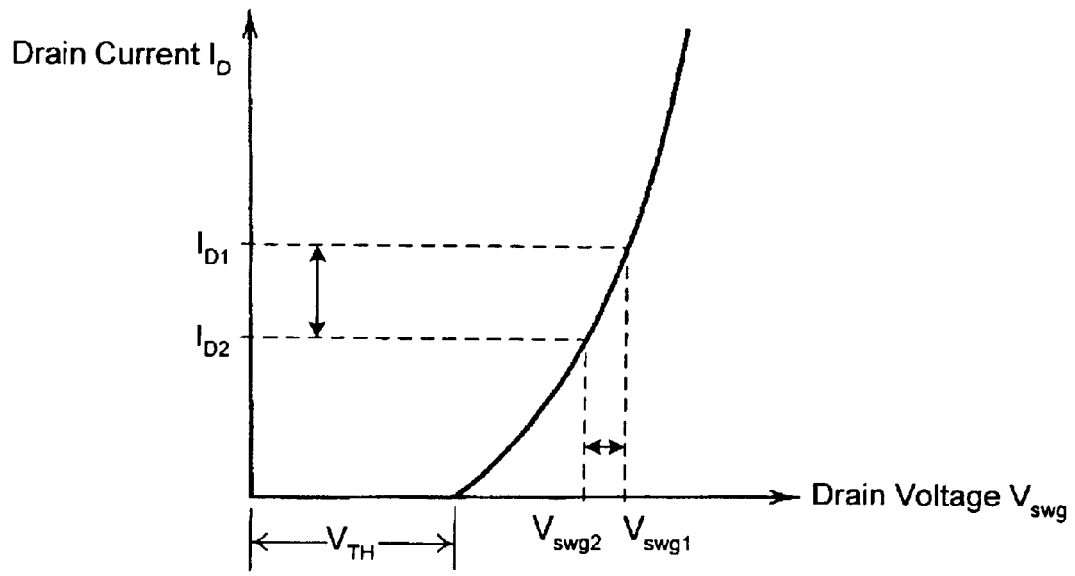
FIG. 10 is a diagrammatic graph of the drain current of a diode-connected enhancement mode NMOS transistor plotted as a function of drain voltage.

In this embodiment, the logic swing voltage, $V_{swg}$, is derived from an NFET transistor 68, since the voltage swing needed for the ACML logic blocks corresponds to the voltage swing needed to switch NFET differential pairs. In this way, the $V_{swg}$ tracks the threshold voltage ($V_{th}$) variations over manufacturing process and temperature. The change in of $V_{swg}$ is relatively small with changes in its drain current, as shown in FIG. 10.

In other embodiments, different logic swing levels, such as Vdd/2, or one derived from a band-gap reference, may be used.

Referring back to FIG. 4, bias current adjustment circuit 36 is operable to adjust the reference current $I_{ref}$ in correlation with a reference clock frequency $f_{ref}$. In particular, bias current adjustment circuit 36 is operable to track the reference clock frequency and increase or decrease the reference current—and consequently the source current of the ACML logic blocks—to attain the required switching speed. In this way, the bias current adjustment circuit 36 achieves the advantage of rail-to-rail logic families (i.e., lower power dissipation at lower clock speeds), while still achieving the advantage of current mode logic families (i.e., reduced current spikes). In the illustrated embodiment, bias current adjustment circuit 36 includes a switching speed reference circuit 84, a frequency comparator 86, and an integrator 88. Switching speed reference circuit 84 is substantially matched to the ACML logic blocks and is operable to generate an output signal $f_{rep}$ that is representative of the logic circuit switching speed.

Figure 11:
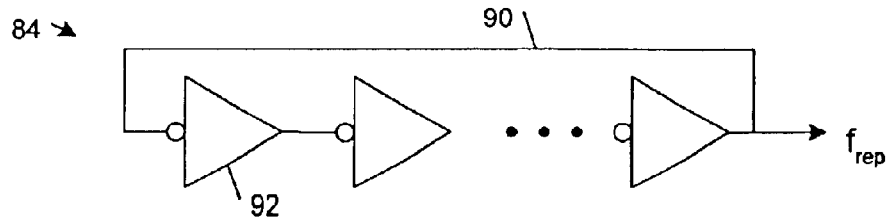
FIG. 11 is a block diagram of a switching speed reference circuit.

Referring to FIG. 11, in one embodiment, switching speed reference circuit 84 is implemented by a ring oscillator 90, which is built from a set of ACML inverters 92. In this configuration, the switching speed reference circuit 84, together with the bias generator 34, acts as a current-controlled oscillator (ICO), where the oscillation frequency is proportional to the reference current $I_{ref}$. The ring oscillator 90 should not squelch over its intended operating range. Since the ring delay inverters are the same ACML family blocks, the speed of the ACML logic blocks 32 will track the speed of ring oscillator 90.

Figure 12:
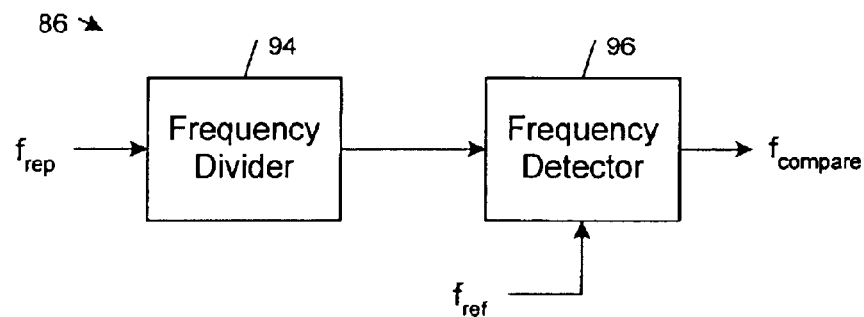
FIG. 12 is a block diagram of a frequency comparator circuit.

Referring to back to FIG. 4 and to FIG. 12, the output signal $f_{rep}$ of the switching speed reference circuit 84 is fed into the input of frequency comparator 86, which is operable to generate an output $f_{compare}$ based on a comparison between the output signal $f_{rep}$ and the reference clock signal $f_{ref}$. In some embodiments, the switching speed reference circuit 84 and the frequency comparator 86 are implemented with ACML logic blocks. As shown in FIG. 12, in one embodiment, frequency comparator may be implemented by a frequency divider 94 and a frequency detector 96. The frequency divider 94 divides the output signal $f_{rep}$ of the switching speed reference circuit 84 by an appropriate amount. The frequency detector compares resulting frequency-divided signal to the reference clock signal $f_{ref}$ and generates an output signal $f_{compare}$ that is indicative of whether the ring-derived frequency is above (up) or below (down) the reference clock frequency. The frequency detector 96 may be implemented as any one of a wide variety of known frequency detectors, including a rotational detector or a stop-watch counter with reset. The up/down indications of the frequency detector 96 are integrated by integrator 88.

Figure 13:
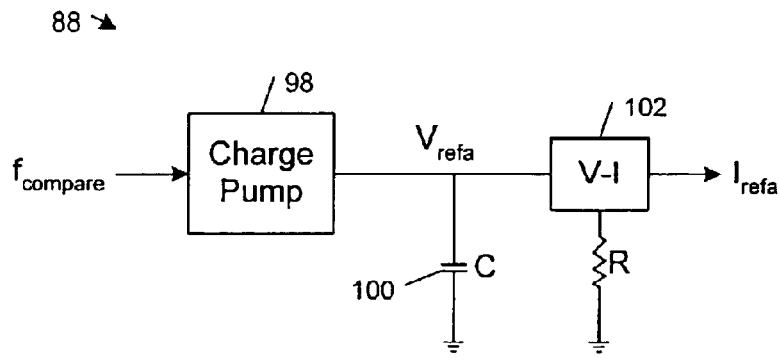
FIG. 13 is a block diagram of an integrator circuit.

Referring to FIG. 13, in one embodiment, integrator 88 includes a charge pump 98 and a capacitor 100. A voltage-to-current (V-I) converter 102 converts the voltage $V_{refa}$ at the charge pump output to an output current $I_{refa}$. Once the divided frequency of the ring oscillator matches that of the reference clock, the reference voltage supplied to the V-I converter 102 dithers around a nominal value. Because the loop is closed, the $V_{csn}$ bias voltage is adjusted to keep the oscillator frequency locked to the external reference clock $f_{ref}$. The frequency variation is determined by the charge pump current, the integration capacitor value, and effective ICO gain.

Figure 14:
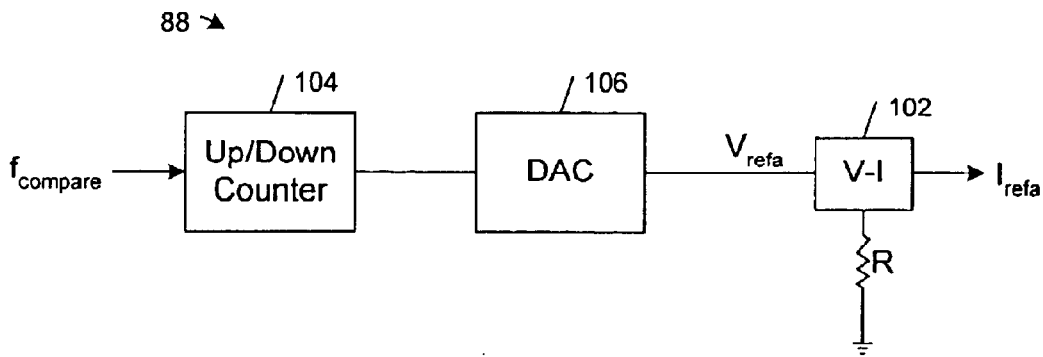
FIG. 14 is a block diagram of another integrator circuit.

Referring to FIG. 14, in another embodiment, integrator 88 is implemented with an up/down counter 104 driving a digital-to-analog converter (DAC) 106, which drives the $V_{refa}$ bias signal. The resolution of the $V_{refa}$ accuracy is based upon the resolution of the DAC 106. In this implementation, the analog function of the integrator embodiment of FIG. 13 is replaced by a digital implementation.

In some embodiments, the V-I converter 102 of the integrator embodiments of FIGS. 13 and 14 may be removed, and the $V_{refa}$ output may be connected directly to $V_{csn}$.

Referring back to FIG. 4, upon power-up, at least some of the ACML logic cells in the illustrated circuit system 30, such as the switching speed reference circuit 84 and the frequency comparator 86, should be functional so that the bias voltage $V_{csn}$ may be ramped up properly. In the illustrated embodiment, current source 42 provides a startup trickle current $I_{start}$ to insure that the ACML logic for the switching speed reference circuit 84 and the frequency comparator 86 are functional. In another embodiment, the frequency comparator 86 is biased by a separate and independent bias generator that is connected to a constant current source. In yet another embodiment, the frequency comparator 86 is implemented with traditional rail-to-rail CMOS logic, which requires no bias. In this embodiment, a logic level translator may be required to match the ACML levels to the levels of CMOS logic.

Other embodiments are within the scope of the claims.

For example, although the above embodiments are described in connection with field effect transistor circuits, these embodiments also may be implemented with other transistor technologies, such as bipolar transistor technologies.

What is claimed is:

1. A circuit system, comprising:
   a logic circuit comprising one or more loads each having an adjustable load resistance, and one or more current mode logic gates each operable to steer a respective tail current to produce an output voltage swing; and
   a bias circuit operable to set the load resistance levels inversely with respect to tail current levels and thereby substantially maintain the voltage swing of each current mode logic gate independent of changes in tail current level.

2. A circuit system, comprising:
   a logic circuit comprising one or more current mode logic sates each operable to steer a respective tail current to produce an output voltage swing wherein the logic circuit has
   a current source coupled to a first voltage rail and operable to supply a source current,
   a load coupled to a second voltage rail and having an adjustable load resistance, and
   a differential pair current steering network coupled between the current source and the load and having complementary inputs and outputs; and
   a bias circuit operable to maintain the voltage swing of each current mode logic sate independent of changes in tail current level, wherein the bias circuit has a source current setting output coupled to the current source and a load resistance setting output coupled to the load, the bias circuit being operable to set the current source to supply a given source current and to set the load inversely with respect to the source current to a load resistance level substantially maintaining a logic swing level between the complementary outputs of the logic circuit for a given source current setting.

3. The circuit system of claim 2, wherein the load comprises a pair of transistors each having a control input coupled to the load resistance setting output of the bias circuit.

4. The circuit system of claim 2, wherein the differential pair current steering network comprises at least one differential pair of transistors.

5. The circuit system of claim 4, wherein the bias circuit comprises a logic swing setting transistor matched substantially to the transistors of the differential pair.

6. The circuit system of claim 5, wherein the logic swing setting transistor is coupled as a diode between the first voltage rail and a logic swing setting output.

7. The circuit system of claim 6, wherein the bias circuit further comprises an operational amplifier coupled as a follower between the logic swing setting output and the load resistance setting output of the bias circuit.

8. The circuit system of claim 7, wherein the load comprises a pair of load transistors each having a control input coupled to the load resistance setting output, and the bias circuit comprises an output transistor matched substantially to the load transistors and having
  a control input coupled to the load resistance setting output,
  a first terminal coupled to the first voltage rail, and
  a second terminal coupled to an inverting input of the operational amplifier.

9. The circuit system of claim 2, wherein the bias circuit is operable to set the current source to supply a given source current based on a received reference current, and further comprising a bias current adjustment circuit coupled to the bias circuit and operable to adjust the reference current in correlation with a reference clock frequency.

10. The circuit system of claim 9, wherein the bias current adjustment circuit comprises a switching speed reference circuit substantially matched to the logic circuit and operable to generate an output signal representative of logic circuit switching speed.

11. The circuit system of claim 10, wherein the switching speed reference circuit comprises a ring oscillator.

12. The circuit system of claim 10, further comprising a frequency comparator operable to generate an output based on a comparison between the output signal of the switching speed reference circuit and a reference frequency signal.

13. The circuit system of claim 12, wherein the frequency comparator comprises a frequency divider coupled to receive the switching speed reference circuit output signal and a frequency detector coupled to the frequency divider and to receive the reference frequency signal.

14. The circuit system of claim 12, further comprising an integrator coupled between the frequency comparator and the bias circuit.

15. The circuit system of claim 12, further comprising a start-up current source operable to supply start-up current to the frequency comparator.

16. The circuit system of claim 12, wherein the frequency comparator is implemented with rail-to-rail CMOS (Complementary Metal Oxide Semiconductor) logic.

17. A circuit system, comprising:
  a logic circuit comprising one or more current mode logic gates each operable to steer a respective tail current to produce an output voltage swing; and
  a switching speed reference circuit operable to detect intrinsic switching speeds of the one or more current mode logic gates.

18. The circuit system of claim 17, wherein the switching speed reference circuit is substantially matched to the logic circuit and is operable to generate an output signal representative of logic circuit switching speed.

19. The circuit system of claim 18, wherein the switching speed reference circuit comprises a ring oscillator.

20. A circuit system, comprising:
  a logic circuit comprising one or more current mode logic gates each operable to steer a respective tail current to produce an output voltage swing; and
  a tail current adjustment circuit operable to dynamically adjust the current mode logic gate tail currents to maintain logic gate switching speed in correlation with a reference clock frequency.

21. The circuit system of claim 20, wherein the tail current adjustment circuit is operable to track the reference clock frequency.

22. The circuit system of claim 21, wherein the tail current adjustment circuit is operable to track logic circuit switching speed.

23. The circuit system of claim 22, wherein the tail current adjustment circuit is operable to adjust the current mode logic tail currents based on a comparison of the tracked reference clock frequency and the tracked logic circuit switching speed.

* * * * *